US007848266B2

(12) United States Patent
Man et al.

(10) Patent No.: US 7,848,266 B2
(45) Date of Patent: Dec. 7, 2010

(54) FREQUENCY SYNTHESIZERS FOR WIRELESS COMMUNICATION SYSTEMS

(75) Inventors: Guanghua Man, Shanghai (CN); Yi Wang, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 270 days.

(21) Appl. No.: 12/220,557

(22) Filed: Jul. 25, 2008

(65) Prior Publication Data

US 2010/0020730 A1    Jan. 28, 2010

(51) Int. Cl.
*H04B 7/00* (2006.01)
*H04B 1/00* (2006.01)

(52) U.S. Cl. .................. 370/277; 455/76; 455/260; 716/18; 327/105

(58) Field of Classification Search ......... 370/277–295, 370/335–348, 395.62, 467; 331/2–34; 327/105–107, 327/146–229, 260; 455/260–268, 76, 86; 716/18; 375/306
See application file for complete search history.

(56) References Cited

U.S. PATENT DOCUMENTS

| 4,965,533 | A | 10/1990 | Gilmore | 331/18 |
|---|---|---|---|---|
| 5,757,239 | A | 5/1998 | Gilmore | 331/18 |
| 5,790,614 | A | 8/1998 | Powell | 375/376 |
| 6,008,703 | A | 12/1999 | Perrott et al. | 332/100 |
| 6,094,101 | A | 7/2000 | Sander et al. | 331/17 |
| 6,326,851 | B1 | 12/2001 | Staszewski et al. | 331/17 |
| 6,359,950 | B2 | 3/2002 | Gossmann et al. | 375/376 |
| 6,429,693 | B1 | 8/2002 | Staszewski et al. | 327/12 |
| 6,515,525 | B2 | 2/2003 | Hasegawa | 327/156 |
| 6,674,332 | B1* | 1/2004 | Wunner et al. | 331/18 |
| 7,155,190 | B2 | 12/2006 | Rathbun, Jr. | 455/260 |
| 7,256,655 | B2 | 8/2007 | He | 331/11 |
| 7,330,057 | B2 | 2/2008 | Nakamuta | 327/156 |
| 2006/0267640 | A1* | 11/2006 | Travis | 327/105 |

FOREIGN PATENT DOCUMENTS

WO    WO 9933182    7/1999

OTHER PUBLICATIONS

PCT Notification of the International Search Report and the Written Opinion of the International Searching Authority, Dated Oct. 19, 2009; for International Application No. PCT/US2009/004142.
Cushing, Rick, "Single-Sideband Upconversion of Quadrature DDS Signals to the 800-to-2500 MHz Band", Analog Dialogue, vol. 34, No. 3, May 2000.
Barrett, Curtis, "Fractional/Integer-N PLL Basics", Technical Brief SWRA029, Texas Instruments, Wireless Communicatiosn Business Unit, Aug. 1999, pp. 1-54.
Simie, Igor, "Evolution of Mobile Base Station Architectures", Microwave Review, Jun. 2007, pp. 29-34.

* cited by examiner

*Primary Examiner*—Afsar M. Qureshi
(74) *Attorney, Agent, or Firm*—Koppel, Patrick, Heybl & Dawson

(57) ABSTRACT

Synthesizers are configured with first and second phase-locked loops (PLL's). The first PLL is arranged to include a digitally-controlled oscillator (DCO) and to respond to an input signal to provide a reference signal with a plurality of selectable reference frequencies. The second PLL is arranged to include a voltage-controlled oscillator (VCO) to thereby provide output signals in response to the reference signal. This synthesizer structure is particularly effective when responding to a noisy input signal as may be the case, for example, in wireless communication systems that provide a network clock to transceivers through lengthy optical links.

18 Claims, 4 Drawing Sheets

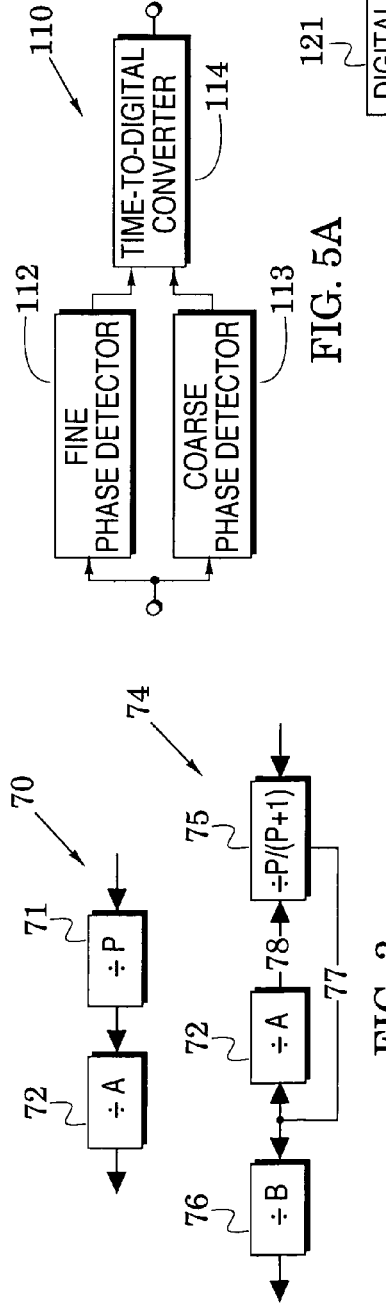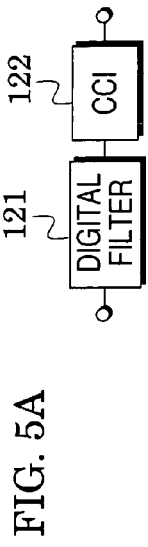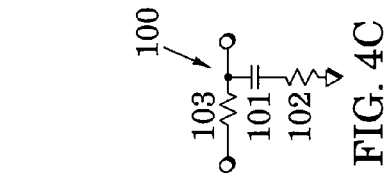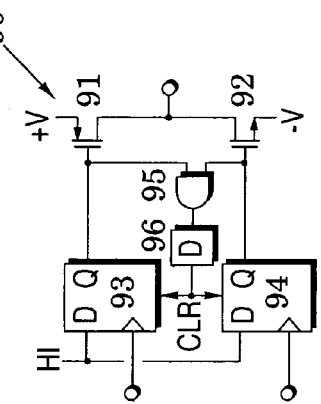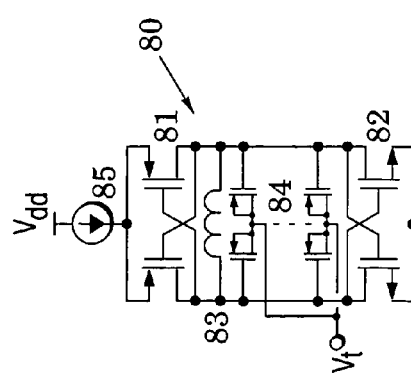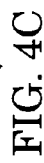

FREQUENCY SYNTHESIZERS FOR WIRELESS COMMUNICATION SYSTEMS

BACKGROUND OF THE INVENTION

1. Field of the Invention

The present invention relates generally to frequency synthesizers.

2. Description of the Related Art

The term wireless in modern wireless communication systems refers to the transfer of information over a distance without the use of electrical conductors. Wireless systems facilitate communications that would be impossible or impractical to implement with the use of wires. Examples of these wireless access systems include:

Wideband Code Division Multiple Access (WCDMA) which utilizes direct sequence code division multiple access (CDMA) techniques;

Time Division—Synchronous Code Division Multiple Access (TD-SCDMA) which uses a combination of synchronous CDMA and Time Division Duplex TDD techniques; and Worldwide interoperability for Microwave Access (WiMAX) which uses orthogonal frequency division multiplexing (OFDM) and is particularly structured to provide "last mile" broadband and internet access as an alternative to conventional systems such as cable and Digital Subscriber Line (DSL).

Many wireless communication systems (e.g., mobile networks) include a series of base stations which are widely distributed through the network. In order to reduce radio-frequency (RF) losses, these base stations are often configured with the RF portions of transceivers (often referred to as remote radio units (RRU's)) positioned close to associated antennas and with the baseband portions of the transceivers positioned at a central location (the hub or base band unit (BBU)) of the base station along with other electronics that conducts various hub processes (e.g., baseband signal generation, modulation, demodulation, coding and framing). The hub typically interfaces, in turn, with a core network which handles other network functions (e.g., processing of subscriber calls).

Baseband signals between the RRU's and the hub are generally carried through an optical link which comprises optical fibers and associated serializer/deserializer (SerDes) circuits that convert signals to serial format for passage through the optical fibers. One of these baseband signals is a network clock that is generated by a network master controller in the hub. The network clock is sent through the optical link to each of the RRU's where it is used to generate and synchronize local oscillator signals and sampling clock signals for up-conversion, and down-conversion, for analog-to-digital and digital-to-analog conversion, and for baseband processing.

Although this base station structure has the advantage that it reduces RF losses between antennas and associated transceivers, it presents other network problems that may cause excessive clock jitter. For example, excessive length of the optical link is often sufficient to induce substantial jitter in the network clock and the subsequent use of clock recovery algorithms may also be the source of excessive jitter. In any case, if the resultant jitter is not significantly reduced during generation of local oscillator signals and other transceiver clock signals, the quality of received and transmitted signals will be degraded.

BRIEF SUMMARY OF THE INVENTION

The present invention is generally directed to frequency synthesizer embodiments. The drawings and the following description provide an enabling disclosure and the appended claims particularly point out and distinctly claim disclosed subject matter and equivalents thereof.

BRIEF DESCRIPTION OF THE DRAWINGS

FIG. 3 illustrates embodiments of a feedback frequency divider in the phase-locked loops of FIG. 1;

FIGS. 4A-4C illustrate embodiments of a voltage-controlled oscillator, phase/frequency detector, and loop filter in the second phase-locked loop of FIG. 1;

FIGS. 5A and 5B illustrate embodiments of a digital phase/frequency detector and a digital loop filter in the first phase-locked loop of FIG. 1.

DETAILED DESCRIPTION OF THE INVENTION

Figure 1:
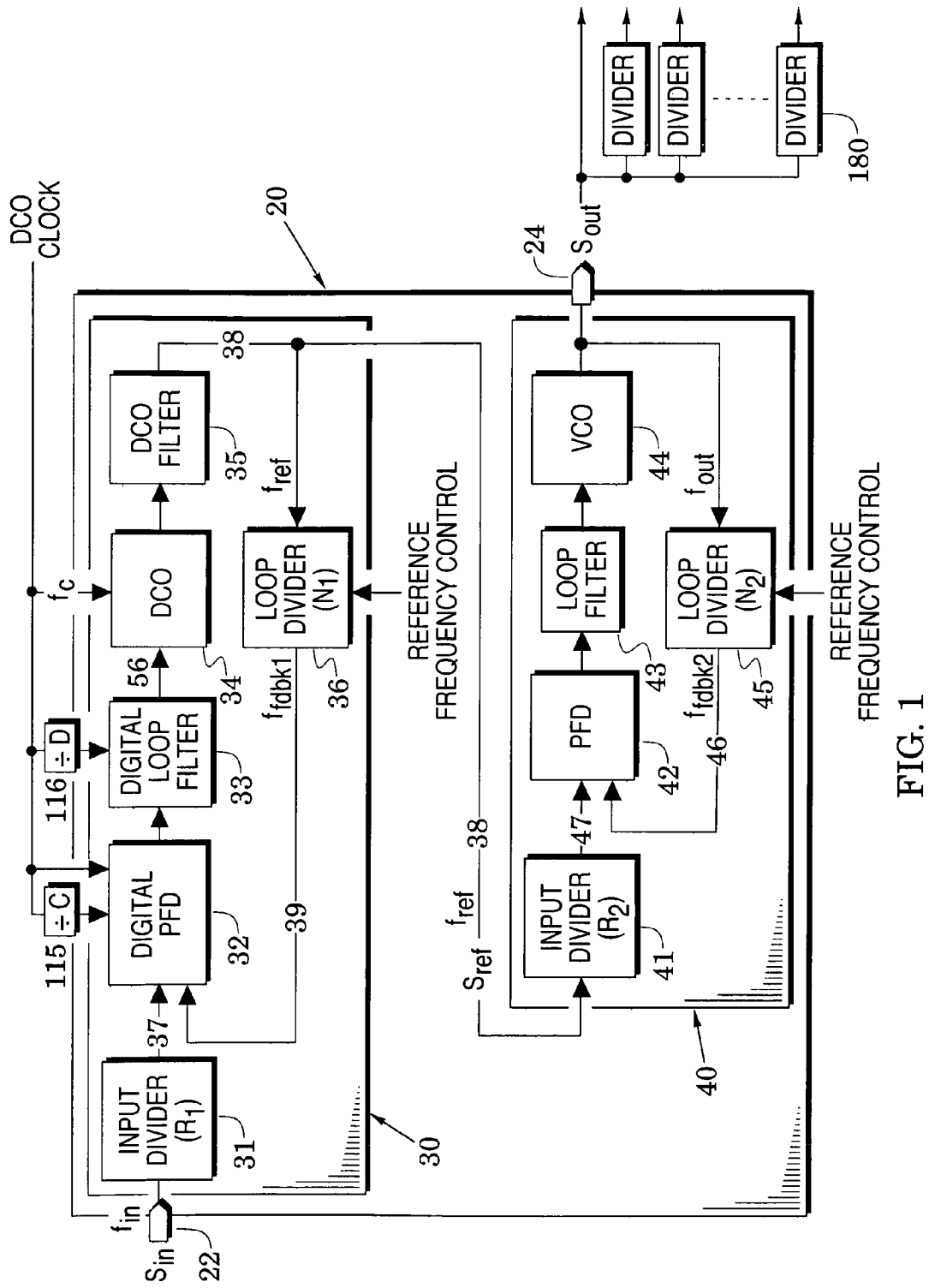
FIG. 1 is a block diagram of a frequency synthesizer embodiment that includes first and second phase-locked loops.

FIG. 1 illustrates a frequency synthesizer embodiment 20 which processes an input signal $S_{in}$ at an input port 22 into an output signal $S_{out}$ at an output port 24. Because of its novel structure, the synthesizer 20 can generate an output signal which provides:

high frequency resolution,
substantially reduced spurious signals, and
low phase noise, even when the input signal is a network clock which includes significant phase jitter. These advantages are provided with first and second phase-locked loop embodiments 30 and 40 whose details are described below.

Attention is initially directed to the first phase-locked loop (PLL) 30 which includes a digital phase/frequency detector 32, a digital loop filter 33, a digitally-controlled oscillator (DCO) 34, a DCO filter 35 and a first feedback frequency divider 36. The digital loop filter is coupled between the digital phase/frequency detector and the DCO and the output of the DCO is processed by the DCO filter to form a reference signal 38 with a reference frequency $f_{ref}$. The reference frequency of the reference signal is then divided by $N_1$ in the first feedback frequency divider to form a feedback signal 39 which is fed back with a feedback frequency $f_{fdbk1}$ as the second input to the digital phase/frequency detector 32.

Action of the locked feedback loop causes the feedback frequency $f_{fdbk1}$ to equal the input frequency $f_{in}$ of an input signal $S_{in}$ that is received at the input port 22. Accordingly, the reference frequency can be expressed as $$f_{ref} = N_1 f_{in}. \tag{1}$$

In a different synthesizer embodiment, a first feedforward frequency divider 31 is inserted to divide the input frequency $f_{in}$ of the input signal by $R_1$ to thereby apply a divided-down signal 37 to the digital phase/frequency detector 32. In this embodiment, action of the locked feedback loop causes the feedback frequency $f_{fdbk1}$ to equal the input frequency $f_{in}$ of the input signal divided by $R_1$. Accordingly, the reference frequency $f_{ref}$ of the reference signal 38 is now given by $$f_{ref} = \frac{N_1}{R_1} f_{in}. \quad (2)$$

Attention is now directed to the second PLL 40 which is arranged as an integer PLL and is formed with a phase/frequency detector (PFD) 42, a loop filter 43, a voltage-controlled oscillator (VCO) 44 and a second feedback frequency divider 45. The loop filter is coupled between the PFD and the VCO and the second feedback frequency divider is arranged to divide the VCO's output signal by $N_2$ to form a feedback signal 46 which is fed back as an input to the PFD 42. The other input to the PFD is the reference signal 38 that is provided by the first PLL 30.

In operation, the second feedback frequency divider 45 receives an output signal having an output frequency $f_{out}$ from the VCO 44 and provides it at a feedback frequency $f_{fdbk2}$ to the PFD 42. Action of the feedback loop causes the feedback frequency $f_{fdbk2}$ to equal the reference frequency $f_{ref}$ of the reference signal 38 that is provided by the first PLL 30. Accordingly, the output frequency can be expressed as $$f_{out} = N_2 f_{ref} \quad (3)$$

which indicates that the output frequency $f_{out}$ is locked to an integer multiple of the reference frequency $f_{ref}$ and, thereby, the second PLL 40 can be referred to as an integer PLL. Equation (3) can be modified by equation (1) to express the output frequency as $$f_{out} = N_1 N_2 f_{in} \quad (4)$$

and can be further modified by equation (2) to express the output frequency as $$f_{out} = \frac{N_1 N_2}{R_1} f_{ref}. \quad (5)$$

In yet another synthesizer embodiment, a second feedforward frequency divider 41 is inserted in the second PLL 40 to divide the reference frequency $f_{ref}$ of the reference signal 38 by $R_2$ before this signal is applied to the PFD 42. In this embodiment, action of the feedback loop causes the feedback frequency $f_{fdbk2}$ to equal the reference frequency $f_{ref}$ of the reference signal divided by $R_2$. Accordingly, the output frequency $f_{out}$ of equation (3) the output signal at the output port 24 is altered to $$f_{out} = \frac{N_2}{R_2} f_{ref} \quad (6)$$

which can be modified by equation (2) to express the output frequency $f_{out}$ in terms of the input frequency $f_{in}$ of the input signal at the input port 22 as $$f_{out} = \frac{N_1}{R_1} \frac{N_2}{R_2} f_{in}. \quad (7)$$

Figure 2A:
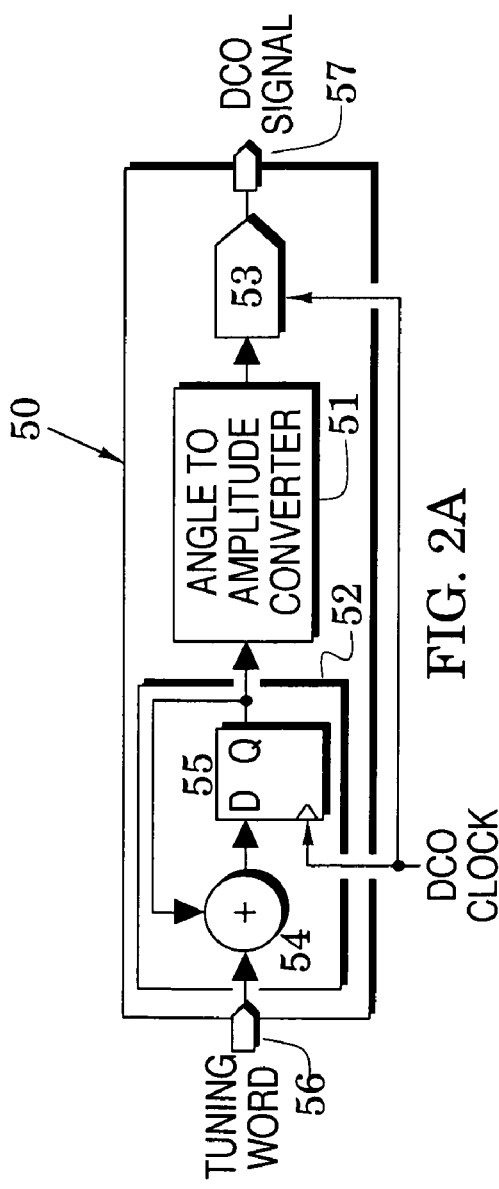
FIGS. 2A and 2B respectively illustrate embodiments of a digitally-controlled oscillator and an associated filter in the first phase-locked loop of FIG. 1.

In embodiments of the first PLL 30 of FIG. 1, the DCO 34 can be formed as the direct digital synthesizer (DDS) 50 of FIG. 2A which includes an angle-to-amplitude converter 51 that is coupled between an accumulator 52 and a digital-to-analog converter (DAC) 53. The accumulator can be realized with a summer 54 that adds the last output of a flip-flop 55 to a tuning word (received at an input port 56) to thereby realize a subsequent output. The accumulator 52 thus counts by tuning word increments until it reaches its word capacity at which time it rolls over and begins again.

The accumulator can be envisioned as a "phase wheel" which rotates at a speed set by the DCO clock (of FIG. 1) which is applied to the flip-flop 55 to thereby generate a repetitive data stream. This repetitive data stream is converted to a data stream that represents a sinusoidal analog signal by the angle-to-analog converter 51 which can be realized, for example, with a look-up table that stores sinusoidal data.

When the tuning word is constant, it is apparent that phase noise of the DCO signal is only a function of the DCO clock which controls phase progression about the "phase wheel" of the accumulator 52. Because the tuning word is only specifying the size of the increments of the progression about the "phase wheel" and not the rate of the progression, its jitter is mostly masked and the noise on the DCO signal is substantially a function of the jitter on the DCO clock. That is, the DCO signal at the output port 57 is substantially decoupled from phase jitter on the tuning word.

As noted above, the DAC 53 responds to the DCO clock signal and turns the digital data stream from the angle-to-analog converter 51 into a sampled analog sinusoidal signal at the output port 57. Although this signal will approximate a sinusoid, it will typically include harmonics with generally-declining amplitudes. In accordance with the laws governing sampled data, the rate of the DCO clock must be at least twice the bandwidth of this signal (which may comprise, for example, a fundamental and its associated harmonics) to avoid undesired aliasing.

Figure 2B:
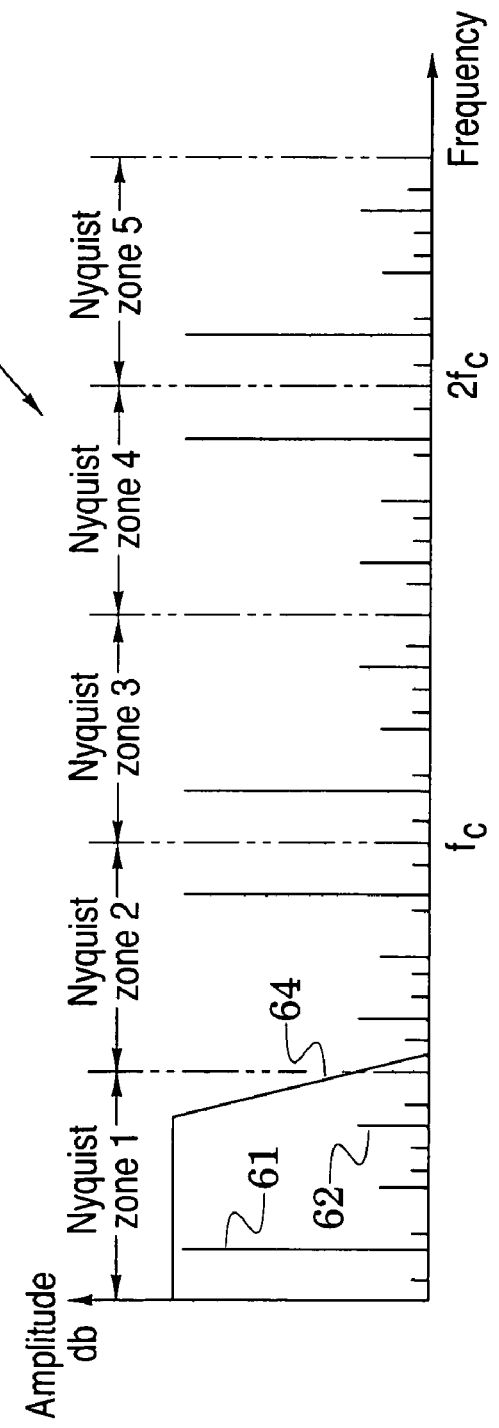

The graph 60 of FIG. 2B is a frequency plot which shows the location of the DCO clock rate $f_c$ and a sequence of Nyquist zones that are defined by that rate. Note that each Nyquist zone has a width of $f_c/2$ and that the clock rate $f_c$ is sufficient to insure that the fundamental 61 and its associated harmonics 62 are contained within the first Nyquist zone. Accordingly, these are completely aliased into the $3^{rd}$ and $5^{th}$ Nyquist zones and mirror images are completely aliased into the $2^{nd}$ and $4^{th}$ Nyquist zones (although not shown in FIG. 4, the signal amplitudes actually decline in accordance with a sinx/x response in the various Nyquist zones).

When used with the DDS 50 of FIG. 2A, the DCO filter 35 of FIG. 1 is preferably configured to act as a low-pass analog reconstruction filter to preserve the baseband signal while substantially rejecting all other images. Accordingly, an exemplary filter passband 64 is shown in FIG. 2B which is configured to pass only the signals in the first Nyquist zone and thereby "reconstruct" the analog signal. Although low pass embodiments of the filter 35 can be formed with conventional arrangements of resistors, capacitors and inductors, other embodiments may be used (e.g., resistors and capacitors arranged in a passive embodiment and capacitors and amplifiers arranged in an active embodiment).

In embodiments of the second PLL 40 of FIG. 1, the feedforward and feedback frequency dividers 41 and 45 can be formed with simple programmable digital counters. The output frequency $f_{out}$ at the output port 24 may, however, exceed the allowable range of a simple counter. To relieve the frequency demands on the feedback frequency divider 45, FIG. 3 shows a loop divider embodiment 70 formed with a programmable counter 72 that is preceded by a fixed high-frequency prescalar 71 which is configured to operate at higher frequencies.

The prescalar divides the output frequency by P and the programmable counter divides the frequency of the signal from the prescalar by A. In this embodiment, the output frequency $f_{out}$ is AP times the reference frequency $f_{ref}$ (assuming an absence of the feedforward divider 41 in FIG. 1). Although the programmable counter 72 now only has to process a reduced frequency $f_{out}/P$, the resolution of the second PLL 40 has been reduced to AP in which P is a fixed number.

In contrast, FIG. 3 also shows a loop divider embodiment 74 in which the prescalar 71 has been replaced by a dual-modulus prescalar 75 which can be commanded to divide by P or by P+1. A second programmable divider 76 which divides by B has been placed after the programmable divider 72 and both programmable dividers divide a signal 77 from the dual-modulus prescalar. A control signal 78 from the programmable divider 72 determines when the dual-modulus prescalar 75 divides by P and when it divides by P+1.

In operation, the divider 75 initially divides by P+1 but when the divider 72 has counted down by A, its control signal 77 causes the divider 75 to subsequently divide by P. At this point, the divider 76 has completed A counts and now performs an additional B-A counts to complete its counting process. Therefore, the total count is A(P+1)+(B-A)P which simplifies to A+PB. As long as A does not exceed P and is always less than B, the loop divider 74 will divide from a minimum count of $P^2-P$ to a maximum count of to $A_{max}+PB_{max}$. Only the dual-modulus prescalar 75 needs to be configured to operate at the output frequency and the resolution has been reduced to A.

In the frequency divider 75, the division ratio is fixed. In another divider embodiment, an accumulator is added to the divider structure of the frequency divider 74 of FIG. 3. In response to the counted-down frequency, the accumulator dynamically changes the divider A so that an "average" division becomes a fraction P+K/F. Out of each F cycles, division by P+1 is accomplished K times and division by P is accomplished F-K times so that an "average" division in P+K/F. Because the resolution is therefore increased to K/F, the PLL's phase noise increase is reduced. This reduction, however, is realized at the cost of spurious signals which are generated by the averaging process.

Having described embodiments of the DCO 34, the DCO filter 35 and the first feedback loop divider 36 of the first PLL 30, attention is now temporarily diverted to elements of the second PLL 40. It is noted that structural embodiments of the second feedforward frequency divider 41 and the second feedback frequency divider 45 are similar to those of the first feedforward frequency divider 31 and the first feedback frequency divider 35.

An embodiment of the VCO 44 of FIG. 1 can be formed with at least one transistor that is coupled to a resonant circuit which includes a varactor whose capacitance varies with the control voltage that is received from the loop filter 43. FIG. 4A, for example, illustrates a VCO 80 which includes an inductor 83 and a set of varactors 84 that are coupled between upper and lower cross-coupled transistor pairs 81 and 82. This cross coupling forms negative feedback which sustains oscillation. Each of the varactors 84 is formed by a pair of transistors whose sources and drains are coupled together and biased by a tuning voltage $V_t$. In each of these transistors, the capacitance between the gate and the coupled sources and drains provides a tunable capacitor. The set of varactors 84 and the inductor 83 thus form a tunable resonant circuit so that the frequency of the feedback-induced oscillation of the VCO 44 is a function of the tuning voltage $V_t$.

FIG. 4B illustrates an embodiment 90 of the PFD 42 of FIG. 1 in which upper and lower transistors 91 and 92 are arranged to pump current into the loop filter (43 in FIG. 1) or pump current out of the loop filter as dictated by the difference between the frequencies of the feedback signal (46 in FIG. 1) and the reference signal (38 in FIG. 1 or the divided reference signal 47 if the second feedforward divider 41 is included). When the phase difference between these frequencies exceeds $2\pi$, an appropriate one of these transistors continually pumps current which is integrated in the loop filter to thereby slew the frequency of the VCO to facilitate locking it to a multiplied version of the reference signal. When the feedback frequency ($f_{fdbk2}$ in FIG. 1) has been slewed sufficiently close to the reference frequency ($f_{ref}$ in FIG. 1), the output loop locks on to the reference signal. In this mode, the PFD is acting as a frequency detector.

When the VCO is substantially phase locked, the upper and lower transistors 91 and 92 supply current spikes of appropriate width to the loop filter which integrates them into a control voltage that keeps the VCO phase locked to the reference signal. In this second mode, the PFD is acting as a phase detector. Flip-flops 93 and 94 are respectively clocked by the reference and feedback signals to thereby respectively drive the upper and lower transistors 91 and 92. A gate 95 clears the flip-flops in response to a delayed (via delay 96) version of their outputs signals.

An embodiment of the loop filter 43 of FIG. 1 can be formed with discrete capacitors and inductors that are arranged as in the loop filter 100 of FIG. 4C and sized to establish a stable loop bandwidth. This lag-lead filter includes a pole formed by a series connection of a capacitor 101 and a resistor 102 and a zero formed by the capacitor and the series combination of the resistor 102 and an input resistor 103. This filter provides two time constants which can be chosen to effectively control loop frequency and damping factor independently. Numerous variations of this loop filter arrangement can be formed to adjust loop bandwidth and stability.

When the VCO 44 is free running, its inherent phase noise is typically quite high close to the carrier but progressively reduces to a desirably low value with sufficient distance (e.g., 2 MHz) from the carrier. In contrast, if the reference frequency 38 were provided by a low-noise reference (e.g., based on a crystal oscillator) the reference phase noise can be much lower close to the carrier than that of the VCO. This reference noise, for example, can decline to a floor a short distance from the carrier (e.g., 10 KHz) and only matches the VCO noise further out (e.g., at 2 MHz). Configuring the loop filter 43 to establish a loop bandwidth of approximately 2 MHz will thus cause the VCO's phase noise to substantially track the phase noise of the reference out to the edge of the loop bandwidth and then smoothly transition to the VCO's inherent phase noise for all points beyond the loop bandwidth.

However, insertion of the second feedback frequency divider 45 significantly alters the phase noise scenario. For frequencies within the loop bandwidth, the second feedback frequency divider 45 essentially multiplies the reference phase noise by 20 log $N_2$. If $N_2$ is on the order of 1000, for example, the reference phase noise will rise 60 dB within the loop. Accordingly, the frequency at which the multiplied reference noise matches the VCO phase noise will be significantly reduced and, accordingly, the loop bandwidth must also be significantly reduced to avoid degrading noise levels in the output signal. The loop bandwidth is now reduced, for example, to the point where the VCO phase noise matches the multiplied reference phase noise.

The phase noise situation described above is significantly degraded if the reference itself is noisy. Some communication systems (e.g., a system described below with reference to FIG. 4) provide a network clock whose phase noise is substantially higher than desired. In this case, not only must the loop bandwidth be further reduced but the noise level within the loop will also rise.

In accordance with the synthesizer 20 of FIG. 1, however, this phase noise degradation is substantially reduced by inserting the structure of the first PLL 30 to which attention is now redirected. FIG. 5A illustrates an embodiment 110 of the digital phase/frequency detector 32 of FIG. 1. The embodiment 110 includes a time-to-digital converter 114 that is preceded by a coarse phase detector 112 and a fine phase detector 113. The coarse phase detector 112 operates at the DCO clock rate $f_c$ and is configured to provide a measure of the time deviation between edges of the signals 37 and 39 in FIG. 1.

The fine phase detector 113 operates in response to a clock signal whose rate is divided down from the DCO clock rate $f_c$ by a divider 115 which divides the DCO clock by a factor C as shown in FIG. 1. This detector is configured to provide a measure of the phase deviation between edges of the signals 37 and 39 in FIG. 1. The time-to-digital converter 114 then provides digital words (to the digital loop filter 33 of FIG. 1) in response to the coarse and fine phase detectors 112 and 113. The division C of the divider 115 is chosen to insure that sample rates in the digital PFD are at least twice the frequency of the signal 37 that is provided to the digital phase/frequency detector 32. The loop is steered towards lock by the coarse phase detector 112 and maintained in a locked condition by the fine phase detector 113.

As shown in an embodiment of FIG. 5B, the digital loop filter 33 can be formed with a digital filter 121 that is followed by a cascaded comb integrator (CCI) 122. The digital filter 121 is configured to mimic the response of an analog loop filter (e.g., a second-order RC filter) to thereby determine the loop bandwidth of the first PLL 30 of FIG. 1 and insure loop stability. The digital filter 121 is also configured to sufficiently oversample the output samples from the time-to-digital converter 114 by a rate determined by a divider 116 which divides the DDS clock by D as shown in FIG. 1.

The CCI 122 is configured to increase the sample rate of the loop filter to be compatible with the rate of the DCO (34 in FIG. 1). In an embodiment, a CCI consists of a series of cascaded differentiators receiving data at a low sample rate connected to an identical number of cascaded integrators processing data at a higher sampling rate.

Having completed descriptions of embodiments of the first PLL 30, it is now apparent that phase noise of the DCO signal at the output port 57 of FIG. 2A is substantially controlled by the phase noise of the DCO clock and is substantially uncoupled from phase noise of the input signal $S_{in}$ at the input port 22 in FIG. 1. As noted above, phase progression about the "phase wheel" of the accumulator 52 is principally determined by the DCO clock and is substantially isolated from the phase noise on the tuning word at the input port 56 in FIG. 2A.

In addition, the inherent phase noise of the DCO 34 is generally lower than that of conventional VCO's so that the loop bandwidth (established by the digital loop filter 33) can be substantially narrowed to permit the DCO's inherent phase noise to determine the output phase noise outside the loop bandwidth.

Accordingly, the first PLL 30 can significantly improve the performance of a synthesizer (e.g., the synthesizer 20 of FIG. 1) when the available input signal (at the input port 22 of FIG. 1) includes excessive phase noise. In addition, the structure of the first PLL 30 is substantially digital so that its parameters are determined by digital words and it does not suffer the typical disadvantages of corresponding analog circuits (e.g., component aging, thermal noise, leakage currents, and component value drift over time).

Because the first PLL 30 is configured to provide a low-noise reference signal 38 to the second PLL 40, the multiplied phase noise in the loop bandwidth of the second PLL is quite low. The loop bandwidth can thus be broadened to the point where the multiplied phase noise within the loop substantially matches the inherent phase noise of the VCO 44. The phase noise at the output port 24 is thus significantly reduced within the loop bandwidth.

The synthesizer 20 of FIG. 1 is thus configured to provide high frequency resolution (set by the divided-down signal 37) and low phase noise. In addition, the DCO filter 35 in the first PLL 30 and the loop filter 43 in the second PLL 43 are configured to significantly reduce spurious signals.

Figure 6:
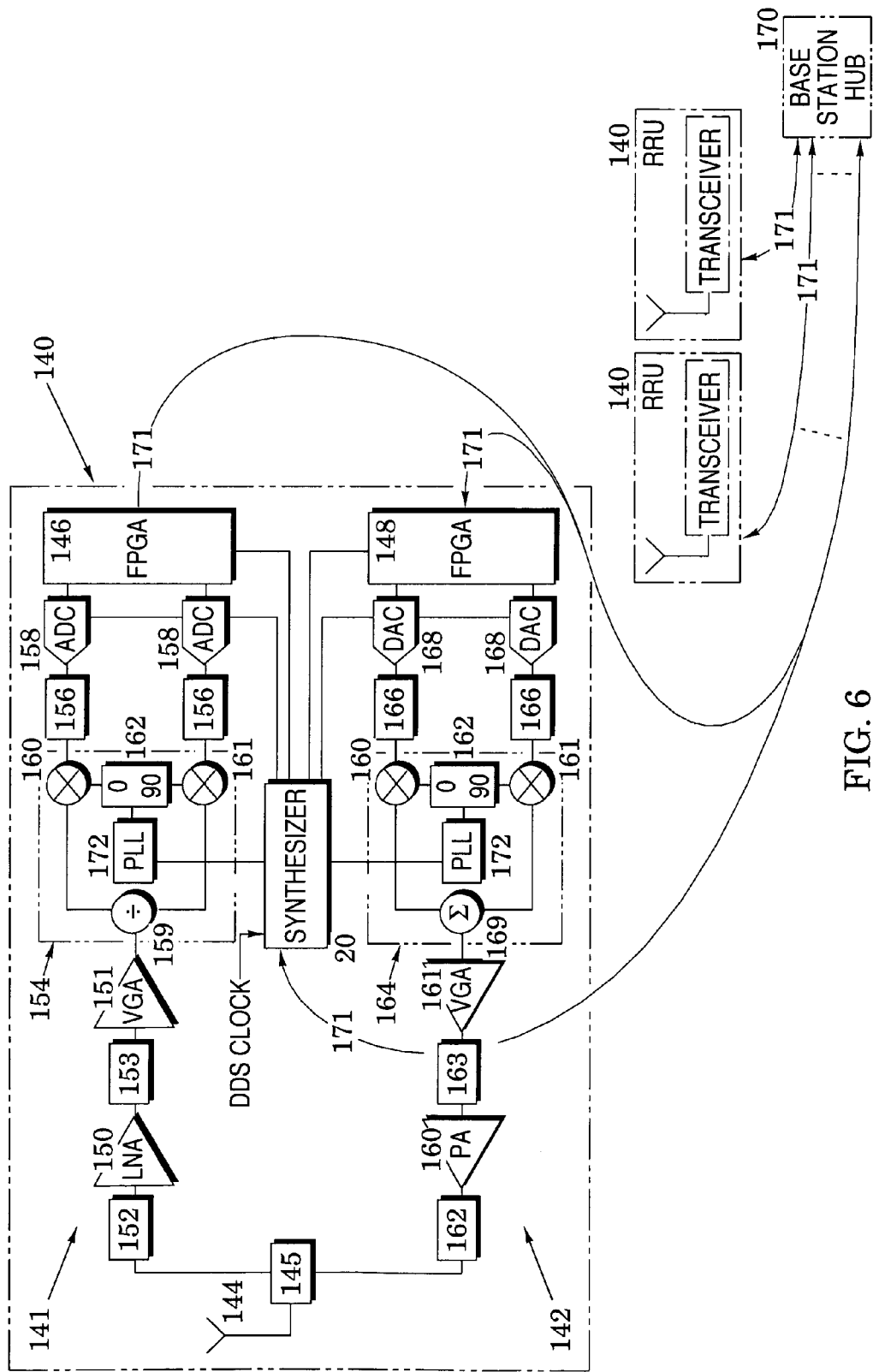
FIG. 6 is a block diagram of a transceiver embodiment that includes the synthesizer of FIG. 1.

FIG. 6 illustrates an exemplary transceiver 140 whose performance may benefit from use of the frequency synthesizer 20 of FIG. 1. In addition to the synthesizer, the transceiver 20, comprises a receiver 141 and a transmitter 142 that are respectively arranged between an antenna 144 (and associated duplexer 145) and a pair of field programmable gate arrays (FPGA's) 146 and 148.

The receiver 141 includes a low-noise amplifier (LNA) 150, a variable-gain amplifier (VGA) 151 and associated filters 152 and 153 that are coupled between the duplexer and a quadrature downconverter 154. It also includes intermediate-frequency filters 156 and analog-to-digital converters 158 that are coupled between the downconverter and the FPGA 146. The quadrature downconverter 154 is formed with a signal splitter 159 that feeds signals from the VGA 151 to a pair of mixers 160 and 161. The downconverter also includes a quadrature splitter 162 that feeds a local oscillator signal from the synthesizer 20 to the mixers 160 and 161.

The transmitter 142 includes a power amplifier (LNA) 160, a VGA 161 and associated filters 162 and 163 that are coupled between the duplexer and a quadrature upconverter 164. It also includes intermediate-frequency filters 166 and analog-to-digital converters 168 that are coupled between the upconverter and the FPGA 148. The quadrature upconverter 164 is formed with elements similar to those in the quadrature downconverter 154 except the splitter 159 is replaced by a summer 169.

As shown in FIG. 6, the transceiver 140 is one of a plurality of transceivers which are coupled to a base station hub 170 of a wireless communication system via optical links 171. Each of the FPGA's performs various baseband processes (e.g., modulation and demodulation) and is connected to the hub by a respective one of the links. In addition, the synthesizer 20 receives a network clock over one of the optical links 171.

As previously mentioned, the length of the optical links can be several kilometers which significantly increases the phase noise at the input port (22 in FIG. 1) of the synthesizer 20. However, the description above shows that the structure of the synthesizer 20 substantially reduces degrading effects that this excess noise might otherwise have on the performance of the transceiver 140.

In different applications of the transceiver 140, the frequency required by the quadrature splitter and summer 154 and 164 may be beyond the capability of the synthesizer 20. Alternatively, the frequencies may need to differ to establish difference between received and transmitted frequencies. Accordingly, local oscillator PLL's 172 and 173 may be inserted between the synthesizer 20 and the quadrature splitter and summer 154 and 164 as shown in FIG. 6.

It is also noted that the ADC's 158, the DAC's 168, and the FPGA's 146 and 148 require local oscillator signals with frequencies that are lower than those required by the downconverter 154 and upconverter 164. These local oscillator signals can be provided by frequency dividers such as the dividers 180 shown in FIG. 1.

In an example in which the frequency synthesizer 20 of FIG. 1 is used to synthesize signals for WCDMA wireless communications system, the input signal at the input port 22 and the divisor of the first feedforward frequency divider 31 can be chosen so that the reference signal 37 is a 10 KHz signal. The reference frequency $f_{ref}$ of the reference signal 38 will then vary between 105.5 and 108.5 MHz in 300 steps (i.e., in step sizes of 10 KHz) as the divisor $N_1$ of the first feedback frequency divider 36 is varied between 10,550 and 10,850. If the divisor of the second feedforward frequency divider 41 is set to two and the divisor $N_2$ of the second feedback frequency divider 45 is set to 40, the frequency of the output signal $S_{out}$ at the output port 24 will vary between 2100 and 2170 MHz in 300 steps (i.e., in step sizes of 200 KHz) as the feedback frequency $f_{fdbk2}$ varies between 52.75 and 54.25 MHz).

In this exemplary use of the frequency synthesizer 20 of FIG. 1, the frequency of the input signal at the input port 22 was kept constant while the divisor $N_1$ of the first feedback frequency divider 36 was varied and the divisor $N_2$ of the second feedforward frequency divider 41 was selected. Obviously, this is only one exemplary method of using the disclosed synthesizer structures. To mention only a few of many other possible methods, the frequency of the input signal $S_{in}$ at the input port 22 can be varied, the divisor $R_1$ of the input divider 31 can be varied, and the divisor $N_2$ of the input divider 41 can be varied to thereby step the frequency of the output signal $S_{out}$ at the output port 24

The embodiments of the invention described herein are exemplary and numerous modifications, variations and rearrangements can be readily envisioned to achieve substantially equivalent results, all of which are intended to be embraced within the spirit and scope of the appended claims.

We claim:

1. A frequency synthesizer system to generate selectable analog output signals in response to an analog input signal, comprising:
a first phase-locked loop (PLL) arranged to include a digitally-controlled oscillator (DCO) and to respond to said input signal to provide a reference signal with a plurality of selectable reference frequencies; and
a second PLL arranged to include a voltage-controlled oscillator (VCO) to thereby provide said output signals in response to said reference signal;
wherein said DCO is configured to respond to a tuning word and a DCO clock whose clock frequency $f_c$ establishes the width $f_c/2$ of a plurality of Nyquist frequency zones and wherein said first PLL includes:
a first feedback frequency divider to provide a divided reference signal;
a low-pass analog reconstruction filter coupled between said DCO and said first feedback frequency divider and configured to substantially reject signals in all but a first one of said Nyquist zones to thereby generate said reference signal;
a digital phase/frequency detector arranged to process said input signal and said divided reference signal; and
a digital loop filter arranged to provide said tuning word to said DCO in response to said digital phase/frequency detector.

2. The synthesizer system of claim 1, further including a first feedforward frequency divider inserted ahead of said digital phase/frequency detector to divide said input signal.

3. The synthesizer system of claim 1, wherein said DCO comprises a direct digital synthesizer which includes:
an accumulator configured to process said tuning word at the rate of said DCO clock;
a digital-to-analog converter; and
an angle-to-amplitude converter coupled between said accumulator and said digital-to-analog converter.

4. The synthesizer system of claim 1, wherein said digital loop filter includes a cascaded comb integrator.

5. The synthesizer system of claim 1, wherein said digital phase/frequency detector includes:
a fine phase detector configured to provide a measure of phase between said input signal and a signal from said first loop frequency divider;
a coarse phase detector configured to provide a measure of time between said input signal and a signal from said first loop frequency divider; and
a time-to-digital converter that drives said digital loop filter in response to said fine and coarse phase detectors.

6. The synthesizer system of claim 1, wherein said second PLL includes:
a second feedback frequency divider;
an analog phase/frequency detector arranged to respond to said reference signal and said second frequency divider; and
an analog loop filter coupled between said analog phase/frequency detector and said VCO.

7. The synthesizer system of claim 6, further including a second feedforward frequency divider inserted ahead of said analog phase/frequency detector to divide said reference signal.

8. A frequency synthesizer system to generate selectable analog output signals in response to an analog input signal, comprising:
a first phase-locked loop (PLL) that includes:
a digitally-controlled oscillator (DCO) configured to respond to a tuning word and a DCO clock;
a first feedback frequency divider;
a low-pass analog reconstruction filter coupled to said DCO to provide a reference signal to said first feedback frequency divider;
a digital loop filter to provide said tuning word; and
a digital phase/frequency detector arranged to drive said digital loop filter in response to said input signal and said first feedback frequency divider; and
a second PLL that includes:
a voltage-controlled oscillator (VCO) to provide said output signal;
a second feedback frequency divider arranged to divide said output signal;
an analog phase/frequency detector arranged to respond to said reference signal and to said second feedback frequency divider; and
an analog loop filter coupled between said analog phase/frequency detector and said VCO;
wherein said DCO comprises a direct digital synthesizer that includes:
an accumulator configured to process said tuning word at the rate of said DDS clock;
a digital-to-analog converter; and
an angle-to-amplitude converter coupled between said accumulator and said digital-to-analog converter.

9. The synthesizer system of claim 8, further including a first feedforward frequency divider inserted ahead of said digital phase/frequency detector to divide said input signal.

10. The synthesizer system of claim 8, further including a second feedforward frequency divider inserted ahead of said analog phase/frequency detector to divide said reference signal.

11. The synthesizer system of claim 8, wherein said digital loop filter includes a cascaded comb integrator.

12. A frequency synthesizer system to generate selectable analog output signals in response to an analog input signal,
a first phase-locked loop (PLL) that includes:
 a digitally-controlled oscillator (DCO) configured to respond to a tuning word and a DCO clock;
 a first feedback frequency divider;
 a low-pass analog reconstruction filter coupled to said DCO to provide a reference signal to said first feedback frequency divider;
 a digital loop filter to provide said tuning word; and
 a digital phase/frequency detector arranged to drive said digital loop filter in response to said input signal and said first feedback frequency divider; and
a second PLL that includes:
 a voltage-controlled oscillator (VCO) to provide said output signal;
 a second feedback frequency divider arranged to divide said output signal;
 an analog phase/frequency detector arranged to respond to said reference signal and to said second feedback frequency divider; and
 an analog loop filter coupled between said analog phase/frequency detector and said VCO;
wherein said digital phase/frequency detector includes:
 a fine phase detector configured to provide a measure of phase between said input signal and a signal from said first loop frequency divider;
 a coarse phase detector configured to provide a measure of time between said input signal and a signal from said first loop frequency divider; and
 a time-to-digital converter that drives said digital loop filter in response to said fine and coarse phase detectors.

13. A transceiver to respond to a converter signal, comprising:
an antenna;
a duplexer coupled to said antenna;
a receiver coupled to said duplexer and including a quadrature downconverter;
a transmitter coupled to said duplexer and including a quadrature upconverter;
a synthesizer that provides an analog output signal and includes:
 a) a first phase-locked loop (PLL) arranged to include a digitally-controlled oscillator (DCO) and to respond to said converter signal to provide a reference signal; and
 b) a second PLL arranged to include a voltage-controlled oscillator (VCO) to thereby provide an output signal in response to said reference signal; and
receiver and transmitter VCO's that respectively drive said quadrature downconverter and said quadrature upconverter when phase locked to said output signal.

14. The transceiver of claim 13, wherein said DCO is configured to respond to a tuning word and a DCO clock whose clock frequency $f_c$ establishes the width $f_c/2$ of a plurality of Nyquist frequency zones and wherein said first PLL includes:
a first feedback frequency divider to provide a divided reference signal;
a low-pass analog reconstruction filter coupled between said DCO and said first feedback frequency divider and configured to substantially reject signals in all but a first one of said Nyquist zones to thereby generate said reference signal;
a digital phase/frequency detector configured to provide said tuning word in response to said input signal and said divided reference signal; and
a digital loop filter arranged to provide said tuning word to said DCO in response to said digital phase/frequency detector.

15. The transceiver of claim 14, wherein said DCO comprises a direct digital synthesizer which includes:
an accumulator configured to process said tuning word at the rate of said DCO clock;
a digital-to-analog converter; and
an angle-to-amplitude converter coupled between said accumulator and said digital-to-analog converter.

16. The transceiver of claim 14, further including a first feedforward frequency divider inserted ahead of said digital phase/frequency detector to divide said converter signal.

17. The transceiver of claim 13, wherein said second PLL includes:
a second feedback frequency divider;
an analog phase/frequency detector arranged to respond to said reference signal and said second frequency divider; and
an analog loop filter coupled between said analog phase/frequency detector and said VCO.

18. The transceiver of claim 17, further including a second feedforward frequency divider inserted ahead of said analog phase/frequency detector to divide said reference signal.

* * * * *